United States Patent
Lee et al.

(10) Patent No.: US 6,538,233 B1
(45) Date of Patent: Mar. 25, 2003

(54) LASER RELEASE PROCESS FOR MICROMECHANICAL DEVICES

(75) Inventors: W. David Lee, West Newton, MA (US); Paul A. Ruggerio, Peabody, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/992,946

(22) Filed: Nov. 6, 2001

(51) Int. Cl.[7] .............................................. B23K 26/00
(52) U.S. Cl. ................................................. 219/121.85
(58) Field of Search ........................ 219/121.6, 121.85, 219/121.82, 121.83

(56) References Cited

U.S. PATENT DOCUMENTS

| | | |
|---|---|---|
| 4,220,685 A | * 9/1980 | Markow et al. |
| 5,314,572 A | 5/1994 | Core et al. |
| 5,412,186 A | 5/1995 | Gale |
| 5,482,564 A | 1/1996 | Douglas et al. |
| 5,717,513 A | 2/1998 | Weaver |

* cited by examiner

Primary Examiner—Samuel M. Heinrich
(74) Attorney, Agent, or Firm—Wolf, Greenfield & Sacks, P.C.

(57) ABSTRACT

A method for releasing a structure from contact with a substrate in a micromechanical device includes the step of irradiating the structure with energy having parameters selected to produce a thermal gradient normal to the surface of the structure which causes upward bowing and release of the structure from the substrate. Preferably, the structure is irradiated with laser energy and, more preferably, the structure is irradiated with pulsed laser energy. The temperature gradient creates a strain gradient, due to thermal expansion, which causes the structure to bow upwardly. Support elements react and hold the structure up after the thermal gradient has disappeared.

20 Claims, 4 Drawing Sheets

LASER RELEASE PROCESS FOR MICROMECHANICAL DEVICES

FIELD OF THE INVENTION

This invention relates to methods for fabricating micromechanical devices having microstructures suspended above a substrate and, more particularly, to methods for releasing the suspended microstructures from contact with the substrate and other elements of the device.

BACKGROUND OF THE INVENTION

Micromechanical sensors for sensing a physical quantity, such as acceleration, vibration or electrostatic potential, are useful in many applications, including but not limited to airbag deployment and active suspension in automobiles, and guidance systems in military weapons. A micromechanical sensing apparatus may include a micromechanical sensor in the form of a suspended microstructure and a circuit responsive to the micromechanical sensor for providing an output representative of a sensed quantity. The suspended microstructure includes stationary and movable elements which are conductive. The micromechanical sensor may be configured for sensing acceleration. When an acceleration sensor of this type is subjected to an accelerative force, the movable element moves relative to the stationary element, producing an output that is sensed by the circuit. The stationary and movable elements form a capacitor which changes in capacitance when the sensor is subjected to an accelerative force.

In fabricating suspended microstructures, a layer of material is typically deposited over a previously deposited sacrificial layer and then is etched into the desired form. The sacrificial layer is then removed by a wet etching process in which the wafer is exposed to a chemical etching solution that dissolves the sacrificial layer but does not affect the material from which the microstructure is formed. The wafer is then washed in a rinse fluid. As the rinse fluid is removed, the surface tension of the liquid exerts a force on the delicately suspended microstructure, tending to pull the microstructure into contact with the substrate or with other portions of the microstructure. A combination of forces, including adhesive forces and electrostatic forces, makes it difficult to separate the contacting portions. Electrostatic force may also contribute to the initial attraction of the microstructure to the other surfaces. Such contact between the suspended microstructures and the other elements of the device must either be avoided or repaired. Otherwise, the micromechanical device is unusable and must be discarded.

A technique for supporting the microstructures during wet etch is disclosed in U.S. Pat. No. 5,314,572 issued May 24, 1994 to Core et al. Photoresist pedestals are inserted in the sacrificial layer between the suspended microstructure and the substrate, and photoresist spacers are inserted in the microstructure layer between non-contacting portions of the suspended microstructure, so that the photoresist pedestals and spacers support the microstructure during the wet etching and drying process used to remove the sacrificial layer. A dry etch is used to remove the support structures. While this approach provides satisfactory results, it involves additional process steps and cost.

Other techniques for unsticking microstructures in micromechanical devices have been proposed in the prior art. A technique which involves the use of a low surface tension liquid with a surfactant or a supercritical fluid is disclosed in U.S. Pat. No. 5,482,564 issued Jan. 9, 1996 to Douglas. A technique which involves irradiation of the device with a set of microwave frequencies is disclosed in U.S. Pat. No. 5,412,186 issued May 2, 1995 to Gale. A technique for repositioning mirror elements of a digital micromirror device by irradiation with a short high energy pulse of visible light is disclosed in U.S. Pat. No. 5,717,513 issued Feb. 10, 1998 to Weaver.

All of the known techniques for releasing suspended microstructures from contact with other elements of the device have had one or more disadvantages, including added cost and complexity, and lack of effectiveness under certain conditions. Accordingly, there is a need for new and improved methods for releasing suspended microstructures from contact with the substrate and other elements of a micromechanical device.

SUMMARY OF THE INVENTION

According to a first aspect of the invention, a method is provided for releasing a structure from contact with a substrate in a micromechanical device. The method comprises the step of irradiating the structure with energy having parameters selected to produce in the structure a thermal gradient normal to the surface of the structure which causes upward bowing and release of the structure from the substrate.

The energy parameters may be selected such that the optical absorption depth of the energy in the structure is about one-third to one-half the thickness of the structure. Preferably, the structure is irradiated with laser energy and, more preferably, the structure is irradiated with pulsed laser energy. The pulsed laser energy may comprise one or more laser pulses applied to the structure.

The temperature gradient produced by the pulsed laser energy creates a strain gradient, due to thermal expansion, which causes the structure to bow upwardly. The structure remains bowed upwardly and free of surface adhesion until the thermal gradient from top to bottom disappears. During the time that the structure is bowed upwardly, the microstructure supports react and continue to hold the structure up.

According to another aspect of the invention, a method is provided for releasing a structure from contact with a substrate in a micromechanical device. The method comprises the steps of selecting energy parameters to produce in the structure a thermal gradient normal to the surface of the structure sufficient to cause upward bowing of the structure, and irradiating the structure with energy having the selected energy parameters, wherein the structure is released from the substrate.

According to a further aspect of the invention, a method is provided for releasing a polysilicon structure from contact with a substrate in a monolithic micromechanical accelerometer. The method comprises the steps of selecting laser energy parameters to produce in the polysilicon structure a thermal gradient normal to the surface of the polysilicon structure sufficient to cause upward bowing of the polysilicon structure, and irradiating the polysilicon structure with laser energy having the selected laser energy parameters, wherein the polysilicon structure is released from the substrate.

In a preferred embodiment, a pulsed laser at a wavelength of 532 nanometers is used for releasing the polysilicon structure from contact with the substrate. The pulsed laser energy may have a pulse width of 5–7 nanoseconds and an average energy density at the polysilicon structure of about 40 to 120 millijoules/square centimeter.

BRIEF DESCRIPTION OF THE DRAWINGS

For a better understanding of the present invention, reference is made to the accompanying drawings, which are incorporated herein by reference and in which.

DETAILED DESCRIPTION

A micromechanical sensing apparatus typically includes a micromechanical device, such as a micromechanical sensor, in the form of a suspended microstructure and a circuit responsive to the micromechanical sensor for providing an output representative of a sensed quantity. Preferably, the micromechanical sensor and the circuit are fabricated on a single substrate in a monolithic construction. In the example described below, the micromechanical sensing apparatus is configured as an accelerometer. However, it will be understood that the micromechanical sensing apparatus can be configured for sensing other physical quantities, such as, for example, vibration or electrostatic potential. Furthermore, the micromechanical device is not limited to micromechanical sensors. In general, the micromechanical device is a microstructure including a stationary element and a movable element, which may be electrically conductive.

Figure 1:
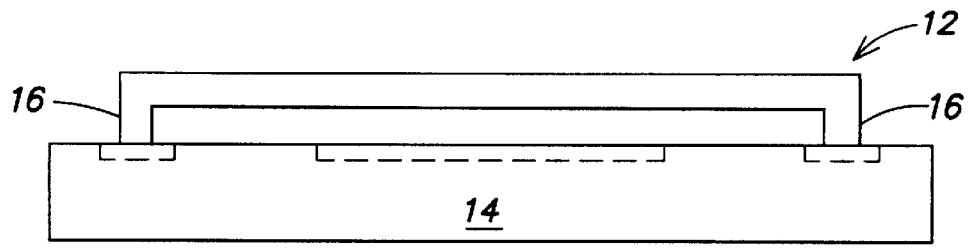
FIG. 1 is a side view of an example of a micromechanical device having a suspended microstructure.
Figure 2:
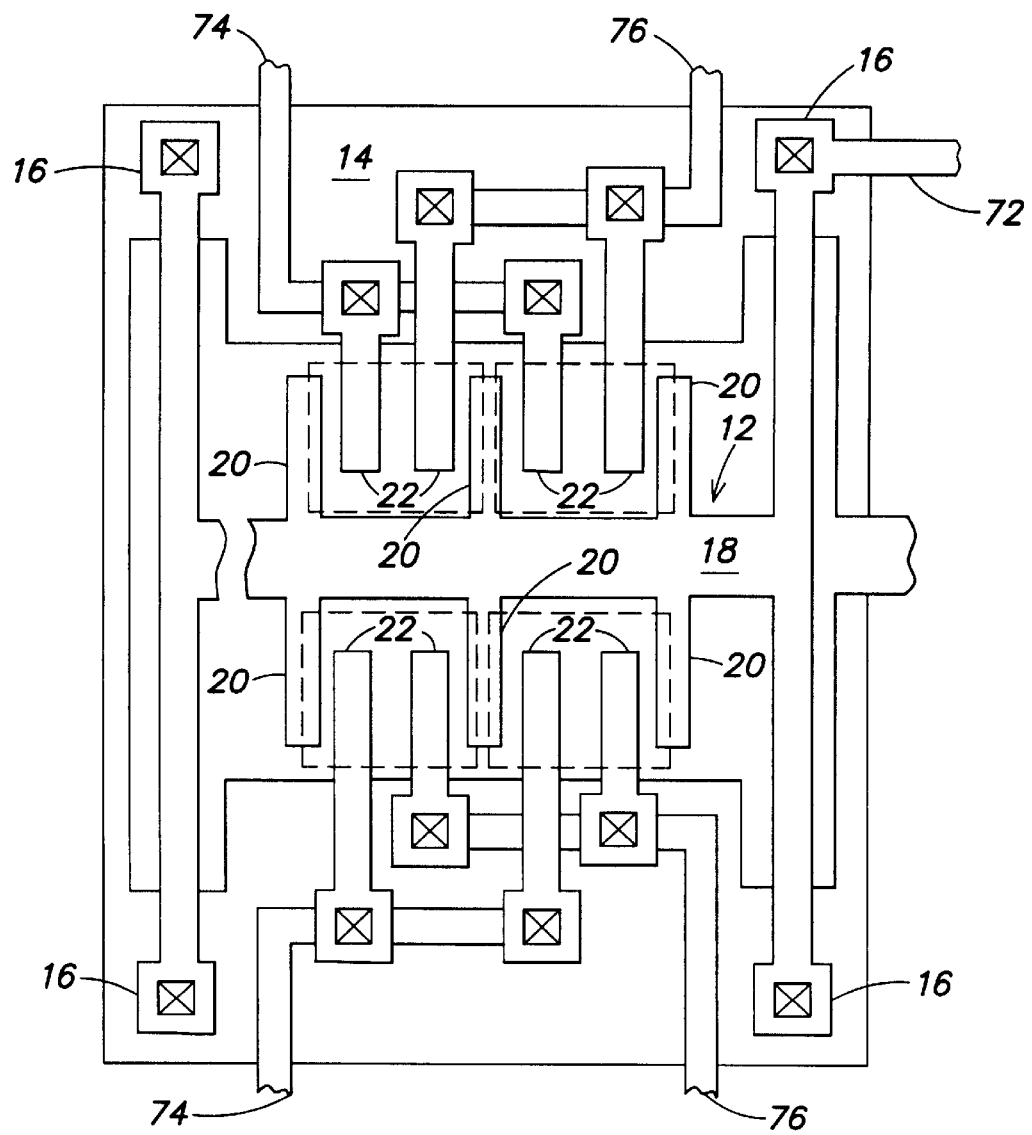
FIG. 2 is a plan view of the micromechanical device shown in FIG. 1.

FIG. 1 is a side view and FIG. 2 is a top plan view of an example of a suspended microstructure. The microstructure includes a polysilicon bridge 12 suspended above a substrate 14 by four corner anchors 16. The bridge includes a central beam 18 having a plurality of movable fingers 20 extending transversely therefrom. A suspended polysilicon stationary finger 22 is positioned parallel and adjacent to each finger 20 of the bridge 12. Stationary fingers 22 are also suspended on anchors and cantilevered over the substrate, but are substantially stationary because of their smaller mass and shorter length of extension beyond the anchor. The polysilicon of the stationary fingers 22 and the bridge 12 is electrically conductive. The stationary fingers are connected via conductors formed in the substrate to comprise two electrical nodes. In particular, the stationary fingers to the left of the corresponding movable fingers form a first node, connected to a lead 76, which is charged to a first voltage. The stationary fingers to the right of the corresponding movable fingers form a second node, connected to a lead 74, which is charged to a second voltage. The beam 12, including the movable fingers forms a third node, connected to a lead 72, which is charged to a third voltage between the first and second voltages.

The first and second sets of stationary fingers and the movable fingers form two capacitors. The two sets of stationary fingers form the first plate of the first and second capacitors, respectively, and the movable fingers form the second plate of both capacitors. When the device is subjected to a force, the beam 12 moves relative to the stationary fingers 22, thus altering the capacitance between each stationary finger and its corresponding movable finger 20. Also, the beam 12 may be electrostatically deflected by application of an AC or DC voltage between the stationary and the movable fingers.

One method for fabricating devices with suspended microstructures as described above is generally termed surface micromachining. Surface micromachining involves additive formation of the microstructure over a substrate. U.S. Pat. No. 5,345,824 issued Sep. 13, 1994 and assigned to the assignee of the present application discloses in detail one such method for manufacturing a surface micromachined suspended microstructure.

As noted above, the process for fabricating suspended microstructures includes a wet etch step for removing the sacrificial layer between the suspended microstructure and the substrate. The wet etch step frequently causes the suspended microstructure to contact and stick to the substrate, thus rendering the micromechanical device inoperative. By way of example, movable fingers 20 and/or central beam 18 shown in FIG. 2 may contact and stick to substrate 14 as a result of the wet etch process.

According to an aspect of the invention, the microstructure is released from contact with the substrate by irradiating the microstructure with energy having parameters selected to produce in the microstructure a thermal gradient normal to the surface of the microstructure which causes upward bowing and release of the microstructure from contact with the substrate. The energy used to irradiate the microstructure is preferably light energy and more preferably is laser energy.

Figure 3:
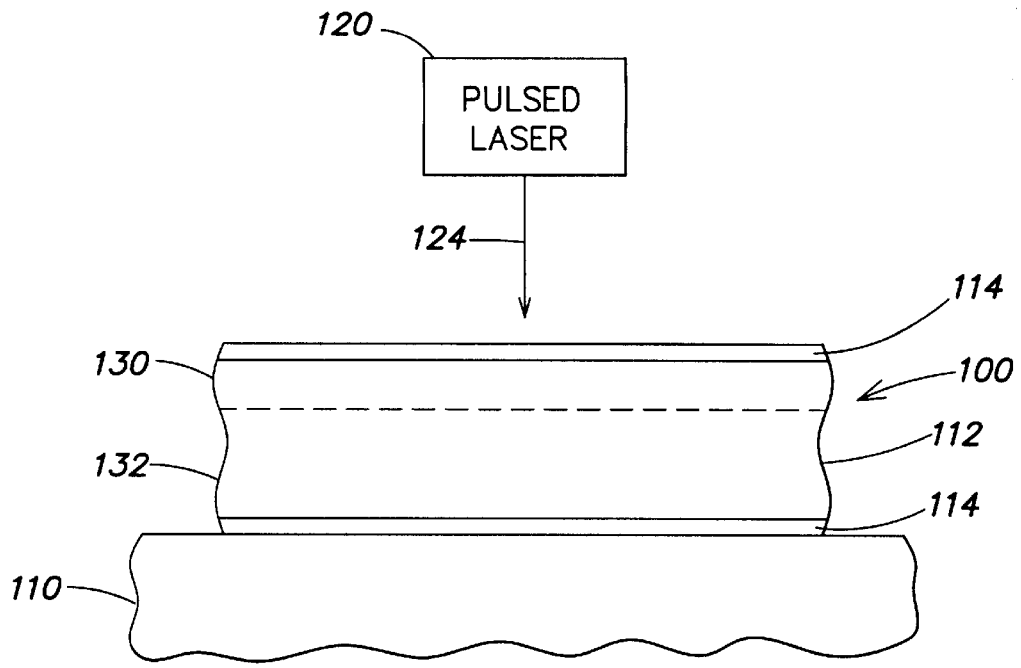
FIG. 3 is a schematic, partial cross-sectional view of the micromechanical device, illustrating an example of the laser release process in accordance with the invention.
Figure 4:
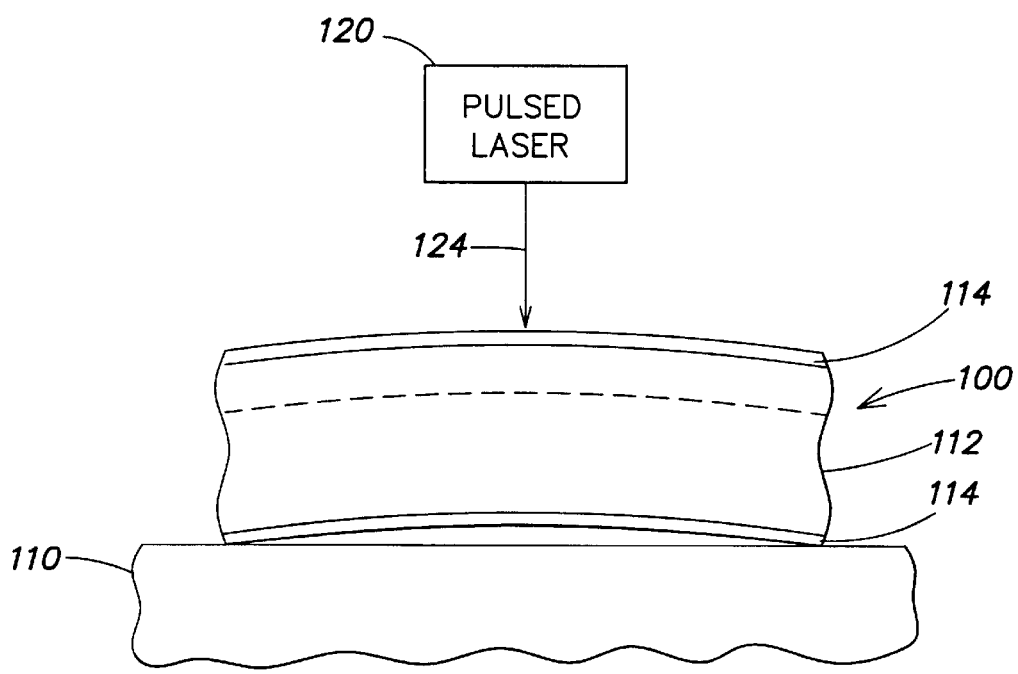
FIG. 4 is a schematic, partial cross-sectional view of the micromechanical device, illustrating upward bowing of the suspended microstructure.

A schematic representation of an embodiment of the process is illustrated in FIGS. 3 and 4. An enlarged, partial cross-sectional view of a micromechanical device is shown. A microstructure 100, normally suspended above a substrate 110 in a functional micromechanical device, is in contact with substrate 110. In a typical micromechanical device, microstructure 100 may be a cantilevered beam or a bridge. The microstructure 100 may include a polysilicon layer 112 having a thickness on the order of about two micrometers and a thin surface layer 114 of oxide. Microstructure 100 may correspond, for example, to central beam 18 or movable fingers 20 shown in FIG. 2. In a functional micromechanical device, microstructure 100 is suspended above substrate by support elements, or tethers, such as corner anchors 16 in FIG. 2. The microstructure 100 may be suspended, for example, by a distance on the order of 1 to 2 micrometers above substrate 110.

In accordance with an embodiment of the process, a pulsed laser 120 irradiates microstructure 100 with a beam 124 of pulsed laser energy. Laser beam 124 is preferably normal to the surface of microstructure 100. The parameters of the pulsed laser energy are selected to produce in microstructure 100 a thermal gradient normal to the surface of microstructure 100. The thermal gradient results from a relatively large temperature rise in an upper portion 130 of microstructure 100 and a relatively small temperature rise in a lower portion 132. Although the microstructure 100 is illustrated as having a boundary between upper portion 130 and lower portion 132, it will be understood that the pulsed laser energy produces a gradual thermal gradient between the top and bottom of microstructure 100.

Because upper portion 130 of microstructure 100 is heated more than lower portion 132, upper portion 130 expands more than lower portion 132. In particular, upper portion 130 of microstructure 100 increases in length parallel to the surface of substrate 110. The difference in thermal expansion between upper portion 130 and lower portion 132 causes microstructure 100 to bow upwardly as shown in FIG. 4 and to be released from contact with substrate 110. The mechanical resilience of the microstructure 100 and the microstructure support elements cause microstructure 100 to remain suspended above substrate 110 after the pulsed laser energy has ended. The mechanical response time of the microstructure support elements is typically on the order of about 10 milliseconds.

The wavelength of the laser energy is preferably selected such that the optical absorption depth in the microstructure is about one-third to one-half the thickness of the microstructure to produce rapid heating and a relatively large thermal gradient. The selected wavelength is a function of the microstructure material and its thickness. In one example, described above, the microstructure includes a polysilicon layer having a thickness of about two micrometers and an oxide surface layer having a thickness of about 30 to 50 angstroms.

Figure 5:
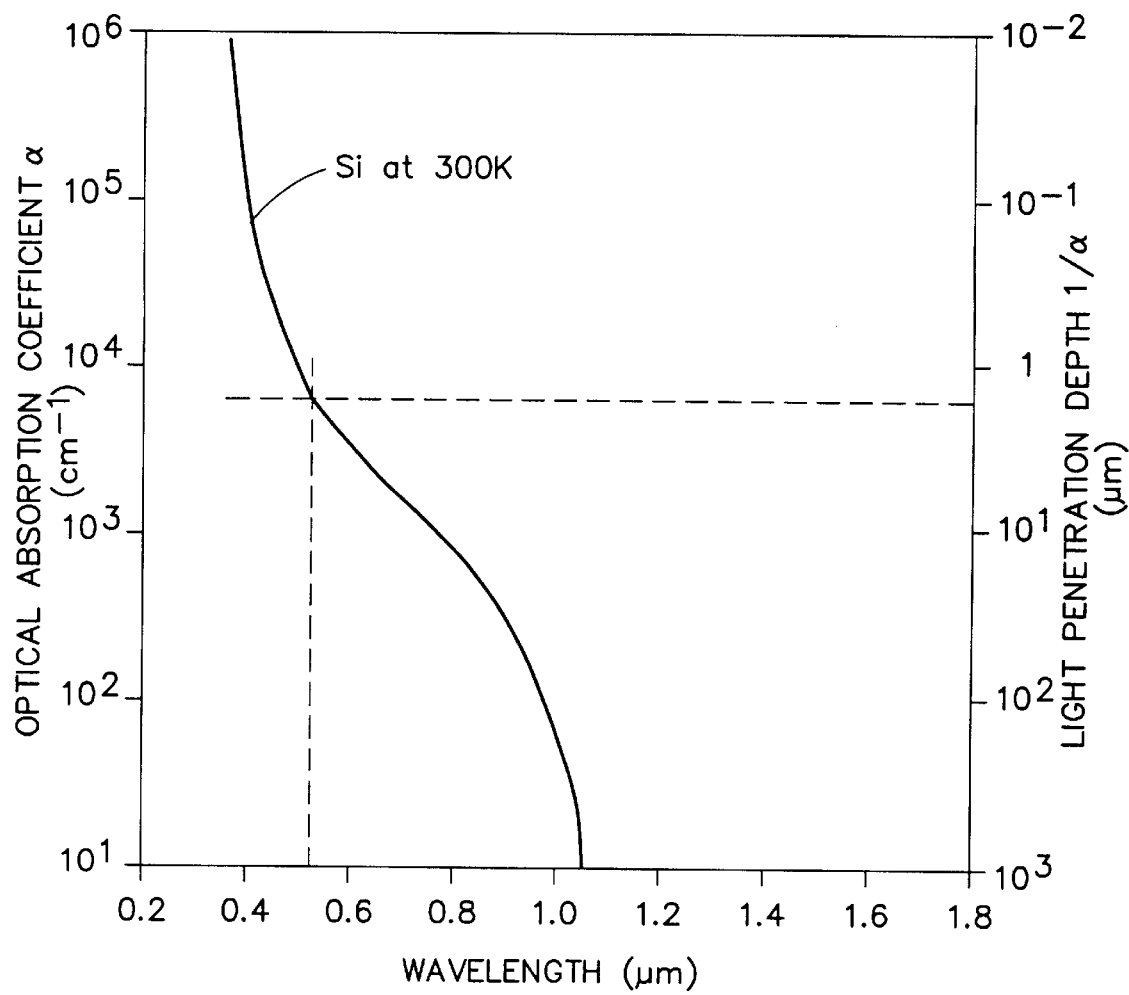
FIG. 5 is a graph of light penetration depth into silicon in micrometers as a function of wavelength in micrometers.

A graph of light penetration depth in micrometers as a function of wavelength in micrometers is shown in FIG. 5 for silicon at room temperature. As indicated by the dashed lines in FIG. 5, a laser wavelength of 532 nanometers has a penetration depth in silicon of about 1.5 to 2 micrometers. The light penetration depth in polysilicon is somewhat less than in single crystal silicon.

To achieve the desired thermal gradient and associated strain gradient in polycrystalline silicon, a penetration depth of less than one micrometer is desired for a microstructure thickness of two micrometers. For a 0.1 micrometer penetration depth, a laser wavelength of 400 nanometers is preferred. Available short pulse Nd:YAG lasers provide a wavelength of 532 nanometers (green). The green laser penetrates into the microstructure about one micrometer, or one-half of its thickness. The laser intensity decreases exponentially with depth in the polysilicon. The surface of the polysilicon receives the most laser energy and experiences a dramatic rise in temperature.

The temperature rise of the polysilicon microstructure may be estimated from the laser energy density and the estimated fraction of the laser energy that is absorbed by the polysilicon. For an energy density at the polysilicon microstructure of 42 millijoules per square centimeter (mj/sq cm) and an absorption fraction of 55%, the temperature rise of the top layer of polysilicon is estimated to be 100° C.

The microstructure will bow upwardly with sufficient temperature gradient from top to bottom. The microstructure may be approximated by a cantilevered beam with a length that is one-half the length of the entire beam. A displacement of about 1.5 micrometers is required to free the beam from contact with the substrate and return the beam to its suspended position. From the equations for a cantilevered beam, it can be determined that the required temperature differential is about 100° C. A laser pulse of 42 mj/sq cm is estimated to raise the top layer of the microstructure about 100° C. and to induce more than the required thermally-induced curvature to release the microstructure and return it to its suspended position.

Based on the above, it is believed that energy densities at the microstructure in a range of about 40 to 120 mj/sq cm are sufficient to release the microstructure. However, the present invention is not limited to this range of energy densities.

A substantial fraction of the laser pulse is absorbed by the optics of the system needed to focus the laser on the microstructure. Therefore, a laser with several times the minimum theoretical power was used. For development work, a laser rated at 500 mj/sq cm was used.

The thermal time constant of the process should be greater than the natural response time for the microstructure. This allows the microstructure supports to respond to the upward bowing when the microstructure is momentarily freed from contact with the substrate. The thermal time constant of the structure is about one second, whereas the mechanical time constant of the microstructure is about 0.1 millisecond. Thus, the relaxation time of the thermal gradient is very long relative to the response time of the microstructure supports. Therefore, the microstructure will remain bowed upwardly and free of contact with the substrate long enough for the microstructure supports to regain control of the microstructure and maintain it suspended above the substrate.

A short laser pulse width within a specific wavelength range may be used to release the microstructure from strong bonding to the substrate. The sequence of events is as follows. The laser energy is incident on the polycrystalline silicon surface. The optical absorption depth of the laser is dependent on the laser wavelength, as shown in FIG. 5. In the first several milliseconds, the layer of polysilicon which absorbs the laser energy is heated, and a temperature gradient from the top exposed surface to the bottom is created. The temperature gradient creates a strain gradient, due to thermal expansion, which causes the microstructure to bow upwardly. The microstructure remains bowed upwardly and free of surface adhesion until the thermal gradient from top to bottom disappears due to thermal equilibrium. During the time that the microstructure is bowed upwardly and free of the surface adhesion forces, the microstructure supports react and continue to hold the microstructure up, provided that this time is greater than the natural response time of the microstructure.

A pulsed Nd:YAG laser at 532 nanometers was used for the following experiments. The laser had a maximum sustainable pulse output energy of 30 mJs and a pulse width of 5–7 nanoseconds. The laser output energy was adjustable over a linear range, while the pulse width was fixed. The system was mounted on an optical bench that had an X-Y wafer chuck mounted vertically at one end. The wafers were held in place by vacuum. Low energy pulses were used to align the wafer. The beam diameter was 2.5 millimeters (0.032 sq cm).

An initial test was done with a wafer containing high G-force accelerometer die. The die were exposed at laser energies of 6, 12, 18, 27 and 30 mJs. Die were exposed to 1, 2 and 3 pulses at each energy level. When one pulse was used, no beams were freed until the 30 mJs energy level was used. At two pulses, beams were freed at the 27 mJs level. At three pulses, the level remained 27 mJs. In the case of two and three pulses, all pulses were applied within one second intervals.

Next, wafers containing low G-force accelerometer die were processed without the pedestal or X-bridge masking level to create a controlled stuck down situation. The beam release etch time was adjusted to compensate for the elimination of the two masking levels. One wafer from the lot was aligned onto the X-Y wafer chuck. A reference row was marked on the wafer. The chuck was moved to index to the next row, and individual die received a single laser pulse at a laser energy of 15 mJs. After indexing to another row, the die received a single pulse of 24 mJs. This was repeated with the energy level set to 30 mJs. Results indicated that beams in the reference row with no laser treatment were stuck down and stuck laterally. Beams in the die that received laser energies of 24 and 27 mJs were no longer stuck down but were stuck laterally. The die that received 30 mJs had no beams that were stuck down or stuck laterally.

A third test was done on the low G-force accelerometer wafers. In this test, the pulse rate was changed from a single pulse to a 30 Hertz pulse rate. The die were scanned at a rate of approximately one die per second, or 30 pulses per die. The laser energy levels were set at 7.5, 15 and 30 mJs. The die exposed to 7.5 mJs were stuck down or laterally, while beams in the die exposed to 15 and 30 mJs were freed.

The minimum laser energy level for one pulse is believed to be 30 mJs. As noted above, optical losses significantly reduce the laser energy delivered to the wafer. Multiple pulses and rapid pulse rates may reduce the energy setting of the laser, but the total energy required to free the microstructure probably remains the same. Overexposure by multiple pulses does not appear to have any adverse effects on the microstructure.

A typical wafer containing micromechanical devices may have a diameter of several inches, whereas a laser beam may have a diameter of a few millimeters. In order to process the entire wafer by irradiation with laser energy as described above, the wafer may be scanned relative to the laser beam. The scanning may be continuous or in steps. Furthermore, the scanning may be achieved by wafer movement, by laser beam movement or by a combination of wafer movement and laser beam movement.

Figure 6:
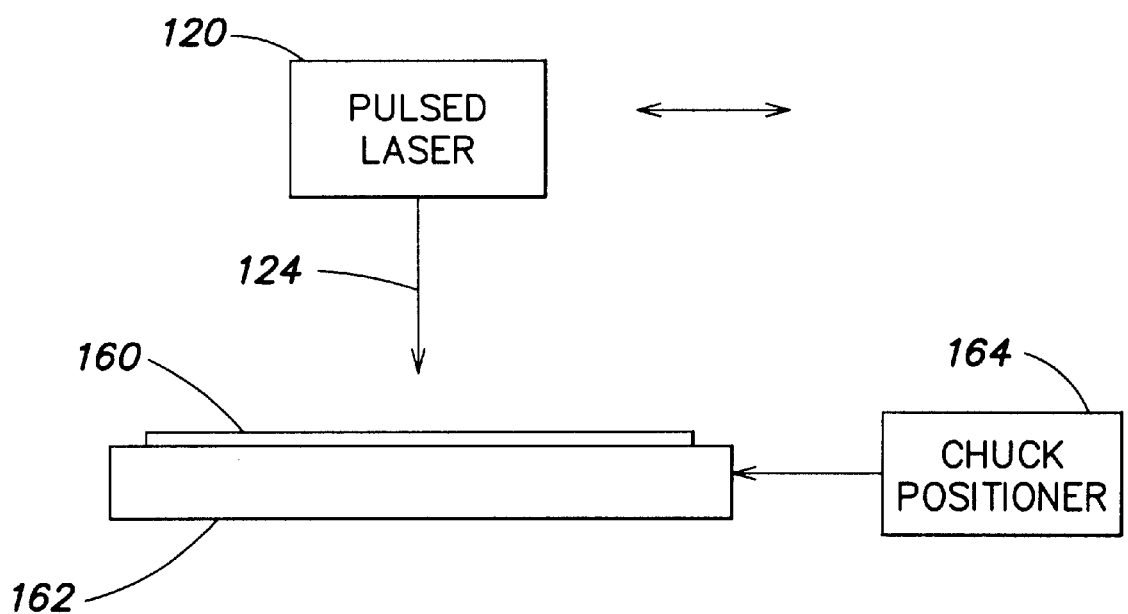
FIG. 6 is a schematic block diagram of a system for scanning a wafer containing micromechanical devices with pulsed laser energy.

A system for scanning a wafer with laser energy is shown schematically in FIG. 6. A wafer 160 containing micromechanical devices is mounted on a stage, such as a vacuum chuck 162. The vacuum chuck 162 may be moved in one or two dimensions relative to laser beam 124 by a chuck positioner 164. Pulsed laser 120 directs laser beam 124 at the surface of wafer 160 to release microstructures from contact with the substrate as described above. In another embodiment, the laser beam 124 may be scanned, either by movement of laser 120 or by deflection of laser beam 124. In a further embodiment, the laser beam or other light beam has a sufficiently large cross section to irradiate the entire wafer or one or more micromechanical devices without scanning.

It should be understood that various changes and modifications of the embodiments shown in the drawings described in the specification may be made within the spirit and scope of the present invention. Accordingly, it is intended that all matter contained in the above description and shown in the accompanying drawings be interpreted in an illustrative and not in a limiting sense. The invention is limited only as defined in the following claims and the equivalents thereto.

What is claimed is:

1. A method for releasing a structure from contact with a substrate in a micromechanical device, comprising the step of:
   irradiating the structure with energy having parameters selected to produce in the structure a thermal gradient normal to the surface of a structure which causes upward bowing and release of the structure from the substrate.

2. A method as defined in claim 1 wherein the step of irradiating the structure with energy comprises irradiating the structure with laser energy.

3. A method as defined in claim 1 wherein the structure comprises polysilicon and wherein the energy comprises laser energy having a wavelength of 532 nanometers.

4. A method as defined in claim 1 wherein the energy parameters are selected such that the optical absorption depth of the energy in the structure is about one-third to one-half the thickness of the structure.

5. A method as defined in claim 1 wherein the step of irradiating the structure with energy comprises irradiating the structure with pulsed laser energy.

6. A method as defined in claim 5 wherein said pulsed laser energy has a pulse width in a range of about 5 to 7 nanoseconds.

7. A method as defined in claim 5 wherein said pulsed laser energy has an energy density at the structure in a range of about 40 to 120 millijoules per square centimeter.

8. A method as defined in claim 5 wherein said pulsed laser energy comprises a series of laser pulses applied to the structure.

9. A method as defined in claim 5 wherein said pulsed laser energy has a wavelength based on the material and thickness of the structure.

10. A method as defined in claim 5 wherein said pulsed laser energy has a wavelength and pulse characteristics selected to produce said thermal gradient.

11. A method as defined in claim 1 wherein the thermal gradient produces a temperature differential through the structure of about 100° C. or greater.

12. A method as defined in claim 1 further comprising the step of scanning said energy with respect to the substrate.

13. In a micromechanical device that requires a structure suspended above a substrate, a method for releasing the structure from contact with the substrate, comprising the steps of:
    selecting energy parameters to produce in the structure a thermal gradient normal to the surface of the structure sufficient to cause upward bowing of the structure; and
    irradiating the structure with energy having the selected energy parameters, wherein the structure is released from the substrate.

14. A method as defined in claim 13 wherein the step of selecting energy parameters comprises selecting laser energy parameters.

15. A method as defined in claim 13 wherein the step of selecting energy parameters comprises selecting pulsed laser energy parameters.

16. A method as defined in claim 13 wherein the step of selecting energy parameters comprises selecting a wavelength and pulse characteristics for irradiating the structure with pulsed laser energy.

17. A method as defined in claim 13 wherein the step of irradiating the structure comprises scanning the energy with respect to the substrate.

18. A method for releasing a polysilicon structure from contact with a substrate in a monolithic micromechanical accelerometer, comprising the steps of:
    selecting laser energy parameters to produce in the polysilicon structure a thermal gradient normal to the surface of the polysilicon structure sufficient to cause upward bowing of the polysilicon structure; and
    irradiating the polysilicon structure with laser energy having the selected laser energy parameters, wherein the polysilicon structure is released from the substrate.

19. A method as defined in claim 18 wherein the step of selecting laser energy parameters comprises selecting laser energy parameters such that the optical absorption depth of the laser energy in the polysilicon structure is about one-third to one-half of its thickness.

20. A method as defined in claim 18 wherein the step of selecting laser energy parameters comprises selecting laser energy having a wavelength of 532 nanometers, a pulse width in a range of about 5 to 7 nanoseconds, and an energy density at the polysilicon structure in a range of about 40 to 120 millijoules per square centimeter.

* * * * *